United States Patent [19]
Ihara

[11] Patent Number: 5,469,392
[45] Date of Patent: Nov. 21, 1995

[54] SEMICONDUCTOR MEMORY

[75] Inventor: Makoto Ihara, Sakurai, Japan

[73] Assignee: Sharp Kabushiki Kaisha, Osaka, Japan

[21] Appl. No.: 363,978

[22] Filed: Dec. 23, 1994

Related U.S. Application Data

[63] Continuation of Ser. No. 116,906, Sep. 3, 1993, abandoned.

[30] Foreign Application Priority Data

Sep. 8, 1992 [JP] Japan ................................. 4-239813

[51] Int. Cl.$^6$ .................................................. G11C 7/06
[52] U.S. Cl. ................... 365/205; 365/189.09; 365/208; 327/66
[58] Field of Search ........................ 365/205, 189.09, 365/208; 307/530, 355; 327/66

[56] References Cited

U.S. PATENT DOCUMENTS

| | | | |
|---|---|---|---|
| 3,838,295 | 9/1974 | Lindell | 365/205 |
| 4,047,059 | 9/1977 | Rosenthal | 327/66 |
| 4,169,233 | 9/1979 | Haraszti | 365/205 |
| 4,504,748 | 3/1985 | Oritani | 307/530 |
| 4,616,148 | 10/1986 | Ochii et al. | 307/530 |
| 4,658,157 | 4/1987 | McGowan | 327/66 |
| 4,697,112 | 9/1987 | Ohtani et al. | 307/530 |
| 4,825,110 | 4/1989 | Yamaguchi et al. | 307/530 |
| 4,973,864 | 11/1990 | Nogami | 365/205 |
| 5,053,998 | 10/1991 | Kannan et al. | 365/205 |
| 5,166,550 | 11/1992 | Matsubara et al. | 327/66 |
| 5,227,697 | 7/1993 | Sakagami | 365/205 |

OTHER PUBLICATIONS

Shimada, H., et al., "An 18ns 1Mb CMOS SRAM" *1988 IEEE International Solid-State Circuits Conference Digest of Technical Papers*, First Edition, (Feb. 1988) pp. 176–177.

Primary Examiner—Joseph E. Clawson, Jr.
Attorney, Agent, or Firm—Morrison & Foerster

[57] ABSTRACT

A semiconductor memory includes a memory cell for storing data; a bit-line pair to be charged to an electric potential corresponding to the data stored in the memory cell; a data-line pair to be electrically connected to the bit-line pair; and a main amplifier for amplifying an electric potential difference of the data-line pair and outputting a signal corresponding to the data. The main amplifier restrains itself from outputting the signal corresponding to the data until the electric potential difference of the data-line pair becomes higher than a predetermined value.

5 Claims, 9 Drawing Sheets

SEMICONDUCTOR MEMORY

This application is a continuation of application Ser. No. 08/116,906, filed Sep. 3, 1993 now abandoned.

BACKGROUND OF THE INVENTION

1. Field of the Invention

The present invention relates to a semiconductor memory such as a dynamic RAM.

2. Description of the Related Art

FIG. 5 shows part of a circuit for a conventional semiconductor memory (one of memory blocks), including a memory cell array 1, a row decoder 2, a column predecoder 3, column decoders 4, a main amplifier 20, an output circuit 6, word lines 30, bit-line pairs 31 (each consisting of bit lines 31A and 31B), and a data-line pair 32 (consisting of data lines 32A and 32B), etc.

The memory block of FIG. 5 has 256 column decoders and 256 bit-line pairs.

The row decoder 2 selectively sets a word line 30 among the plurality of word lines 30 active in accordance with input row addresses. Herein, the phrase "to set a signal line active" means "to set a signal line into a logically activated state or a selected state, by setting the potential of the signal line to a certain value". Similarly, the phrase "to set a signal line inactive" used herein means "to set a signal line into a logically inactivated state or a non-selected state, by setting the potential of the signal line to another certain value".

The column predecoder 3 selectively sets one signal line active in each of four signal-line sets (CA01, CA23, CA45, and CA67), in accordance with the input column addresses (CA0 to CA7). Each of the signal-line sets consists of four signal lines. Depending on the combination of the signal lines which are selectively set active by the column predecoder 3, any one of 0th to 255th column decoders is selected. A column signal line 47 which is connected to the selected column decoder is set active. At this time, a switching transistor pair 34 which is connected to the activated column signal line 47 is turned ON, so that the bit-line pair 31 corresponding to the selected column decoder and the data-line pair 32 are electrically connected to each other.

A bit line precharge signal generating circuit 7 generates a bit line precharge signal. In accordance with the bit line precharge signal, each electric potential of the bit lines 31A and 31B is precharged up to ½ $V_{cc}$, where $V_{cc}$ represents a power supply potential.

When the bit line pair 31 is being precharged, a sense amplifier driving signal generating circuit 8 sets each electric potential of a PMOS sense amplifier driving signal line 48 and an NMOS sense amplifier driving signal line 49 to ½ $V_{cc}$. Where the sense amplifier 9 operates, the sense amplifier driving signal generating circuit 8 sets the electric potential of the PMOS sense amplifier driving signal line 48 to $V_{cc}$, and the potential of the NMOS sense amplifier driving signal line 49 to GND.

The sense amplifier 9 amplifies the electric potential difference read out from the memory cell 33 to the bit-line pair 31.

The main amplifier 20 amplifies the electric potential difference of the data-line pair 32. An output circuit 6 outputs a signal for identifying the data stored in the memory cell 33 at an output terminal 35 in accordance with the output of the main amplifier 20.

A timing generating circuit 10 sets signal lines 51 to 55 active at a predetermined timing. The signal lines 51 to 55 are connected to the row decoder 2, the bit line precharge signal generating circuit 7, the sense amplifier driving signal generating circuit 8, the column predecoder 3, and the main amplifier 20, respectively.

FIG. 6 shows an exemplary configuration of the conventional main amplifier 20 and the output circuit 6. The main amplifier 20 includes two differential amplifiers 60 and 61. FIG. 7 shows an exemplary configuration of the conventional differential amplifier 60. As shown in FIG. 7, the differential amplifier 60 includes an NMOS transistor 80 connected to a negative input terminal 63B, an NMOS transistor 81 connected to a positive input terminal 63A, and a transistor 84 for pulling down the electric potential of a junction 88 between the source of the NMOS transistor 80 and the source of the NMOS transistor 81. The differential amplifier 61 has the same structure as the differential amplifier 60 does.

Hereinafter, an operation of the differential amplifier 60 will be described in the following cases (1) and (2). The differential amplifier 61 operates in the same manner as the differential amplifier 60 does.

(1) When an electric potential of an activating signal input into an activating terminal 62 of the main amplifier 20 is at a low level (L), an electric potential of a signal output from an output terminal 69 of the differential amplifier 60 is set to be at a low level (L).

(2) When the electric potential of the activating signal input into the activating terminal 62 of the main amplifier 20 is at a high level (H), the electric potential of the signal output from the output terminal 69 of the differential amplifier 60 is determined on the basis of the relationship between electric potentials of the signals input into the positive input terminal 63A and the negative input terminal 63B as follows:

(a) When the electric potential of the signal input into the positive input terminal 63A is higher than that of the signal input into the negative input terminal 63B, the electric potential of the signal output from the output terminal 69 of the differential amplifier 60 is set to be at a high level (H).

(b) When the electric potential of the signal input into the positive input terminal 63A is lower than that of the signal input into the negative input terminal 63B, the electric potential of the signal output from the output terminal 69 of the differential amplifier 60 remains at the low level (L).

When the signal line 55 is set to be active, the electric potential of the activating signal input into the activating terminal 62 is turned to a high level (H). Therefore, the differential amplifiers 60 and 61 operate according to the case (2) described above.

In FIG. 6, each of main amplifier output lines 37A and 37B is precharged to reach a high level (H) by an output circuit precharge signal which is input via a terminal 66. Herein, it is assumed that when the main amplifier output lines 37A and 37B are set to be active, the electric potentials thereof are at a low level (L); and when they are set to be inactive, the electric potentials thereof are at a high level (H). Furthermore, the output circuit 6 outputs data H to the output terminal 35 when the electric potential of the main amplifier output line 37A is turned to a low level (active state); and the output circuit 6 outputs data L to the output terminal 35 when the electric potential of the main amplifier output line 37B is turned to a low level (active state). That is, a state where the main amplifier output line 37A is set to be active (L) corresponds to data H; and a state where the main amplifier output line 37B is set to be active (L) corresponds to data L.

When the activating signal is input via the activating terminal 62, the main amplifier 20 amplifies the electric potential difference between the data lines 32A and 32B, and then outputs a signal having the amplified electric potential difference to the main amplifier output lines 37A and 37B, respectively.

Hereinafter, the operation of the main amplifier 20 will be described in the following cases (1) and (2).

(1) When an electric potential of the data line 32A is higher than that of the data line 32B, the electric potential of the signal output from the differential amplifier 60 is set to be at a high level (H), and the electric potential of the signal output from the differential amplifier 61 is set to be at a low level (L). As a result, the electric potential of the main amplifier output line 37A is reduced to a low level (active state), and the electric potential of the main amplifier output line 37B remains at the high level (inactive state). At this time, the output circuit 6 outputs the data H to the output terminal 35.

(2) When the electric potential of the data line 32A is lower than that of the data line 32B, the electric potential of the signal output from the differential amplifier 60 is set to be at a low level (L), and the electric potential of the signal output from the differential amplifier 61 is set to be at a high level (H). As a result, the electric potential of the main amplifier output line 37A remains at the high level (inactive state), and the electric potential of the main amplifier output line 37B is reduced to a low level (active state). At this time, the output circuit 6 outputs the data L to the output terminal 35.

When the main amplifiers output lines 37A and 37B are precharged, i.e., when each electric potential of the main amplifier output lines 37A and 37B is at a high level (H), the output terminal 35 has a higher impedance. When the electric potential of the main amplifier output line 37A is reduced to a low level (active state), the output circuit 6 outputs an output signal having a high level (H) of electric potential from the output terminal 35. On the other hand, when the electric potential of the main amplifier output line 37B is reduced to a low level (active state), the output circuit 6 outputs an output signal having a low level (L) of electric potential from the output terminal 35.

FIG. 8 shows electric potential variations of various signal lines during the operation of the semiconductor memory in which the conventional differential amplifiers 60 and 61 of FIG. 6 are included in the main amplifier 20. In FIG. 8, the horizontal axis represents time, and the vertical axis represents voltage. In this conventional example, the data read out from the memory cell 33 is assumed to be at a low level (L).

The timing generating circuit 10 sets the signal line 52 inactive, and the signal lines 51, 53, 54, and 55 active, respectively. As a result, each electric potential of these signal lines 51 to 55 changes as shown in FIG. 8.

When the signal line 52 is set to be inactive, the bit line precharge signal generating circuit 7 makes the electric potential of the bit line precharge signal to the low level (L).

When the signal line 51 is set to be active, the row decoder 2 selectively makes one word line 30 active in accordance with the input row addresses.

When the signal line 53 is set to be active, the sense amplifier driving signal generating circuit 8 changes the electric potential of the PMOS sense amplifier driving signal line 48 from ½ $V_{cc}$ into $V_{cc}$ (power supply electric potential), and also changes the electric potential of the NMOS sense amplifier driving signal line 49 from ½ $V_{cc}$ to GND.

When the signal line 54 is set to be active, the column predecoder 3 selectively makes one of four signal lines active in the signal-line set CA01, in accordance with the input column addresses (CA0 to CA7). As described above, one of four signal lines of each of the other three signal-line sets (CA23, CA45, and CA67) has already been selectively set to be active.

The column decoder 4 sets a column signal line 47 active at the same time when one signal line in the signal line set CA01 is selectively set to be active, depending on the combination of signal lines which are selectively set active by the column predecoder 3. When the switching transistor pair 34 which is connected to the column signal line 47 is turned to ON, the bit-line pair 31 and the data-line pair 32 are electrically connected to each other.

When the signal line 55 is set to be active, the main amplifier 20 amplifies the electric potential difference which is transmitted to the data-line pair 32. In FIG. 8, the electric potential of the data line 32A is higher than that of the data line 32B, so that the electric potential of the main amplifier output line 37B is reduced to a low level (L). On the other hand, the electric potential of the main amplifier output line 37A remains at the high level (H) (i.e., remains at $V_{cc}$).

Conventionally, the signal line 55 for activating the main amplifier 20 must be set active after a predetermined period of time after the column signal line 47 is set to be active. This is because the main amplifier 20 should be prevented from being activated until the electric potential difference between the data lines 32A and 32B becomes sufficiently large. If the main amplifier 20 is activated before the electric potential difference between the data lines 32A and 32B becomes sufficiently large, there is a possibility that the main amplifier 20 will output wrong data due to the low amount of electric potential difference between the data lines 32A and 32B to be input into the main amplifier 20.

According to the conventional semiconductor memory, a delay time should previously be set, from a time when the column signal line 47 is set to be active to a time when the signal line 55 for activating the main amplifier 20 is set to be active. That is, the main amplifier 20 should be prevented from being activated until the electric potential difference between the data lines 32A and 32B becomes sufficiently large. Furthermore, when the above-mentioned delay time or a period of time required for making the electric potential difference between the data lines 32A and 32B sufficiently large varies widely, the main amplifier 20 may be activated before the electric potential difference between the data lines 32A and 32B becomes sufficiently large, so that there is a possibility that the main amplifier 20 will output wrong data. Even when the above mentioned delay time is set to have sufficient margin in order to avoid such a problem, there arises another problem in that the access time of the semiconductor memory is inevitably increased due to the unnecessary long delay time.

SUMMARY OF THE INVENTION

The semiconductor memory of this invention, has a memory cell for storing data; a bit-line pair to be charged to an electric potential corresponding to the data stored in the memory cell; a data-line pair to be electrically connected to the bit-line pair; and a main amplifier for amplifying an electric potential difference of the data-line pair and outputting a signal corresponding to the data; in which the main amplifier restrains itself from outputting the signal corresponding to the data until the electric potential difference of the data-line pair becomes higher than a predetermined value.

In one embodiment, the main amplifier has a differential amplifier including a positive input terminal connected to one data line of the data line pair and a negative input terminal connected to the other data line of the data-line pair, the differential amplifier restrains itself from inverting an output signal until an electric potential for a signal input into the positive input terminal becomes higher than an electric potential obtained by adding a predetermined voltage to an electric potential for a signal input into the negative input terminal, and the main amplifier outputs the signal corresponding to the data in response to the inversion of the output signal of the differential amplifier.

In another embodiment, the main amplifier has a first differential amplifier and a second differential amplifier each having a positive input terminal and a negative input terminal, the positive input terminal of the first differential amplifier and the negative input terminal of the second differential amplifier are connected to one data line of the data-line pair, the negative input terminal of the first differential amplifier and the positive input terminal of the second differential amplifier are connected to the other data line of the data-line pair; each differential amplifier restrains itself from inverting an output signal until an electric potential of a signal input into the positive input terminal becomes higher than an electric potential obtained by adding a predetermined voltage to an electric potential of a signal input into the negative input terminal, and the main amplifier outputs the signal corresponding to the data in response to the inversion of the output signal of at least one of the first and second differential amplifiers.

In another embodiment, the differential amplifier has a first NMOS transistor connected to the negative input terminal, a second NMOS transistor connected to the positive input terminal, and a transistor for pulling down an electric potential of a junction between the source of the first NMOS transistor and the source of the second NMOS transistor; and an impedance is inserted between the source of the second NMOS transistor and the junction.

According to the semiconductor memory of the present invention, the period of time from a time when a signal line for activating the main amplifier is set to be active to the time when a column signal line is set to be active can be determined irrespective of the period of time required for making an electric potential difference of the data-line pair sufficiently large. For example, both the column signal line and the signal line for activating the main amplifier may be set to be active simultaneously. According to the semiconductor memory of the present invention, when the electric potential of the data-line pair is less than the predetermined value, each of the main amplifier output lines remains inactive (H). Only when the electric potential of the data-line pair becomes higher than the predetermined value, one of the main amplifier output lines becomes active (L).

Thus, the invention described herein makes possible the advantages of (1) providing a semiconductor memory in which the delay time required for activating a main amplifier is not necessarily set, (2) providing a semiconductor memory in which erroneous operation of a main amplifier can be prevented, and (3) providing a semiconductor memory in which an access time can be shorten by saving any unnecessary delay time.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrating an example.

Figure 1:
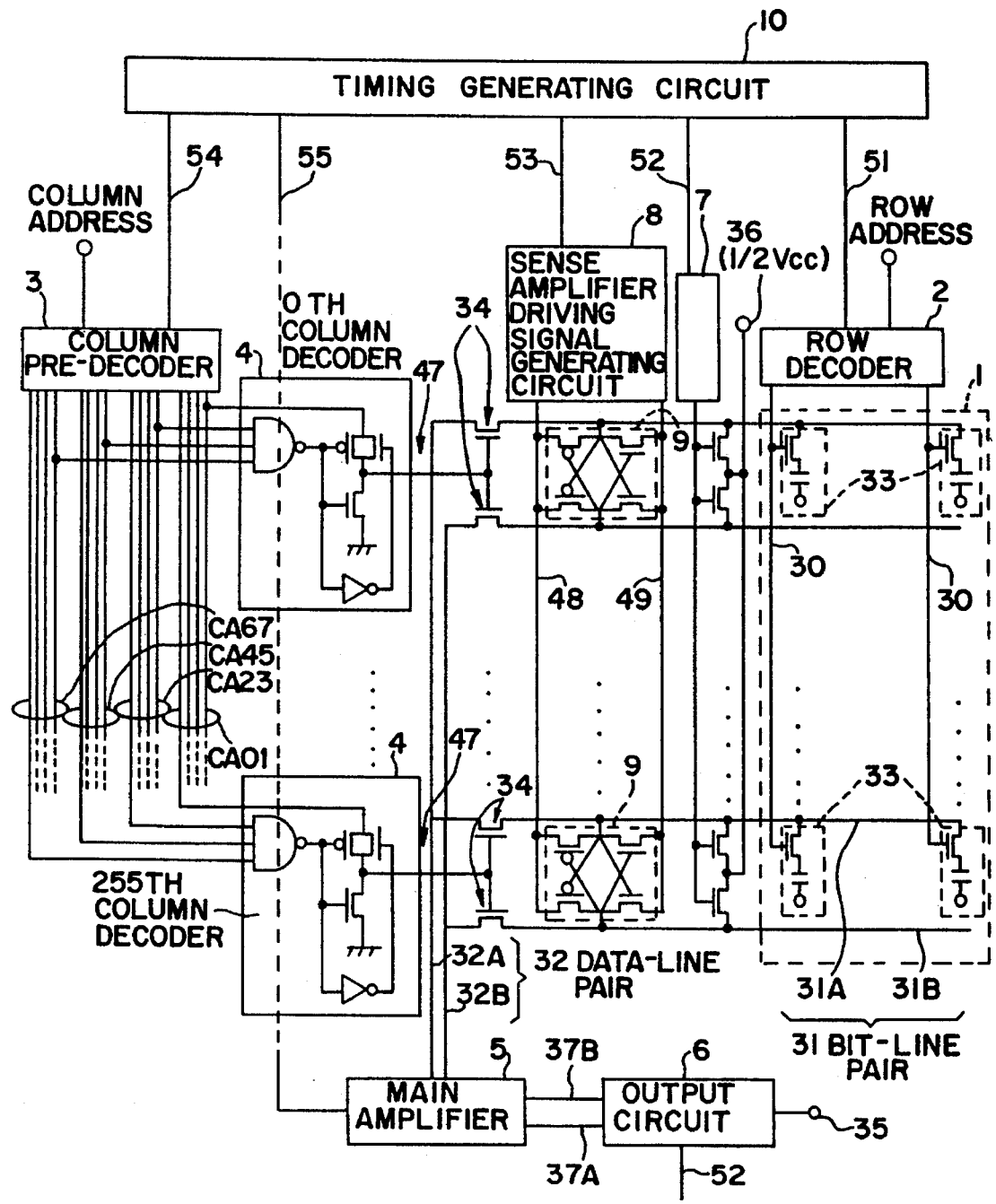
FIG. 1 shows part of a circuit for a semiconductor memory according to the present invention.
Figure 5:
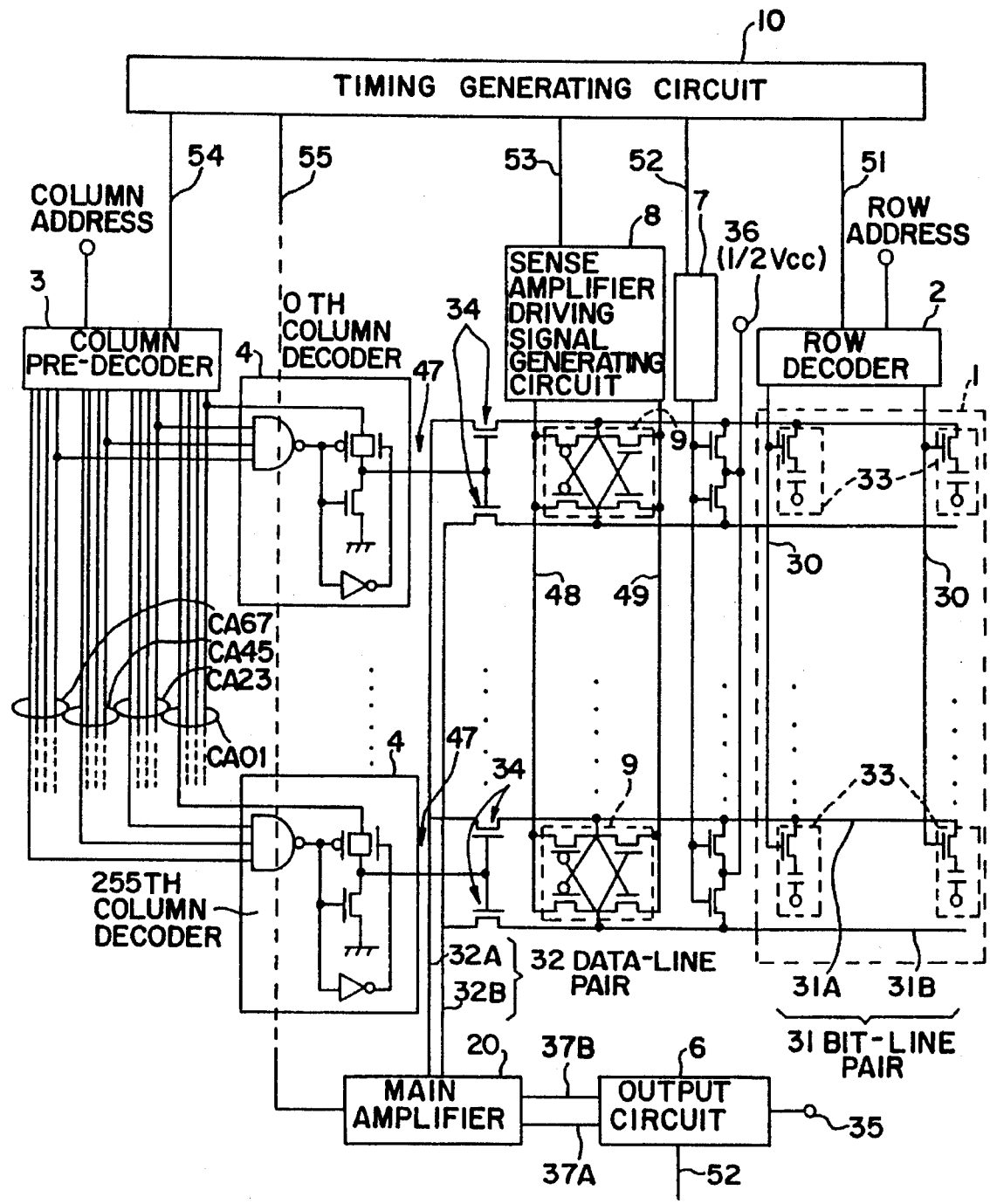
FIG. 5 shows part of a circuit for a conventional semiconductor memory.

FIG. 1 partially shows a circuit of a semiconductor memory according to the present invention. FIG. 1 is identical with FIG. 5 except for a main amplifier 5.

Figure 2:
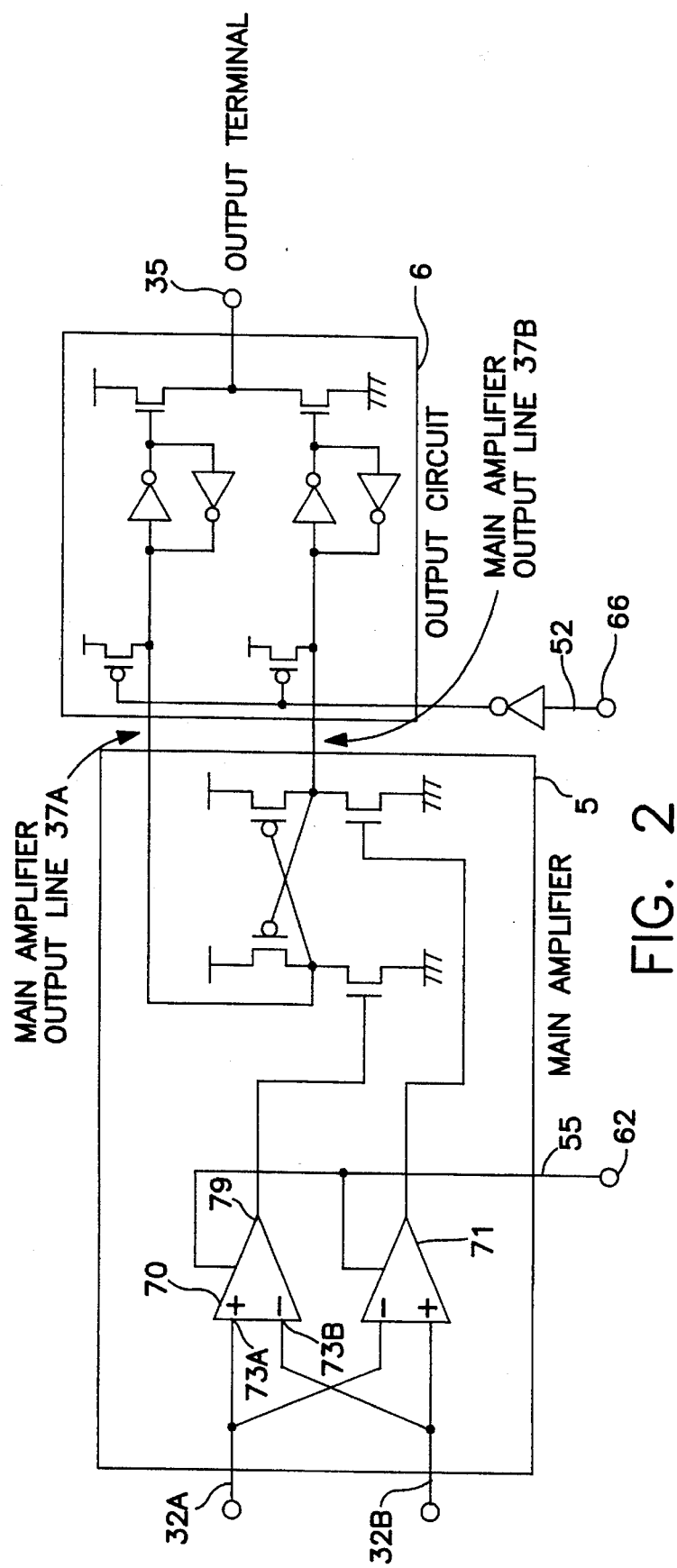
FIG. 2 shows a circuit for a main amplifier of the semiconductor memory of FIG. 1.

FIG. 2 shows exemplary circuits of the main amplifier 5 and an output circuit 6. FIG. 2 shows two differential amplifiers 70 and 71 of the present invention. FIG. 2 is identical with FIG. 6 except for the differential amplifiers 70 and 71.

Figure 3:
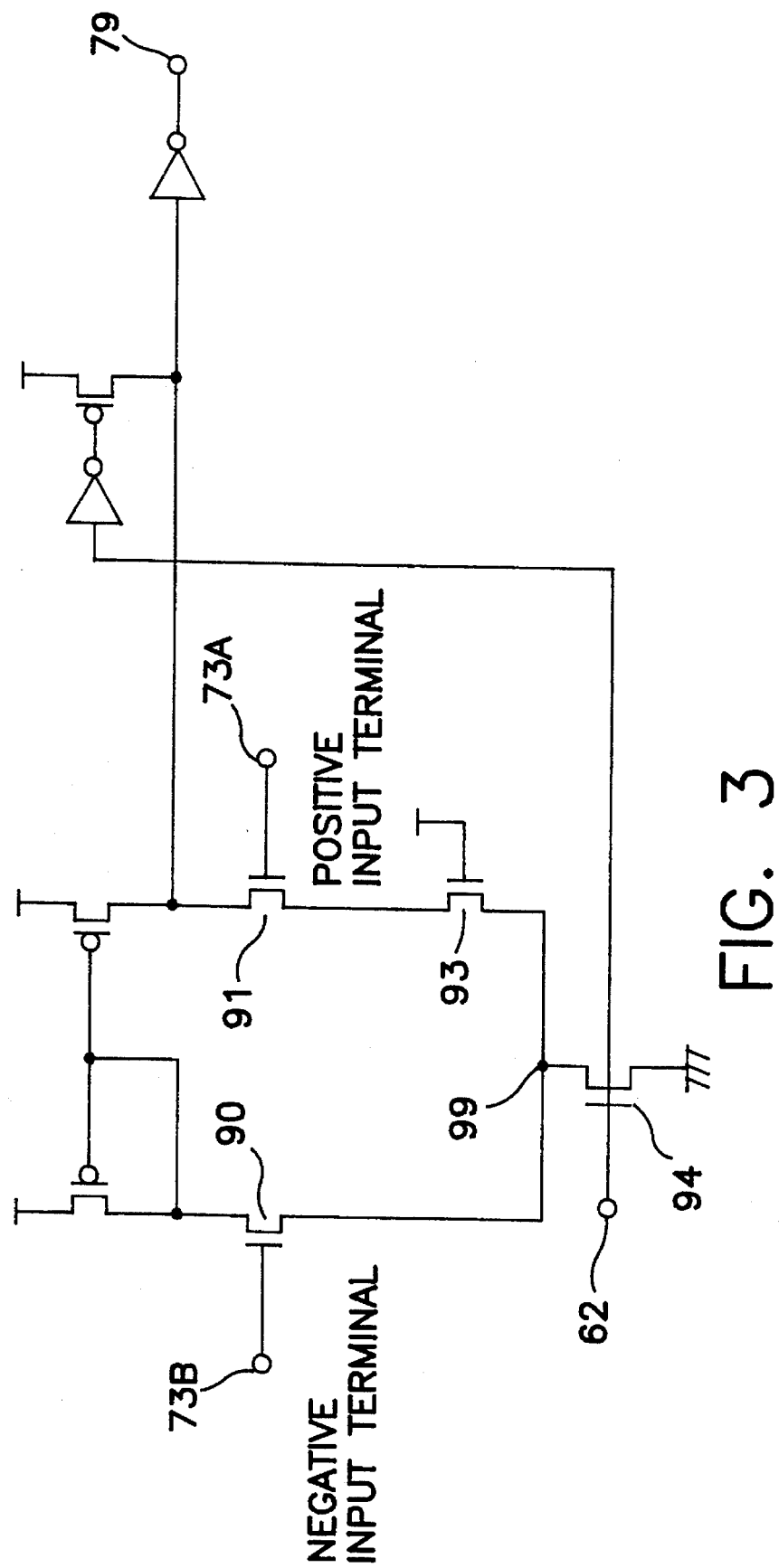
FIG. 3 shows a circuit for a differential amplifier included in the main amplifier of FIG. 2.

FIG. 3 shows an exemplary circuit of the differential amplifier 70 of the present invention. The differential amplifier 71 has the same structure as that of the differential amplifier 70. The differential amplifier 70 is different from the conventional differential amplifier 60 of FIG. 6 in inserting an impedance between an NMOS transistor 91 and a junction 99. In order to insert the impedance between the NMOS transistor 91 and the junction 99, an NMOS transistor 93 is provided between the NMOS transistor 91 and the junction 99 so that the electric potential of the source of the NMOS transistor 91 is higher than that of the source of an NMOS transistor 90. As a result, the differential amplifier 70 restrains itself from inverting an output signal at an output terminal 79 until the electric potential of a signal input into a positive input terminal 73A of the differential amplifier 70 becomes higher than an electric potential obtained by adding a predetermined voltage to an electric potential of a signal input into a negative input terminal 73B of the differential amplifier 70. Herein, the predetermined voltage is referred to as "input offset voltage". Until the signal output from the differential amplifier 70 or the differential amplifier 71 is inverted, that is, until the electric potential difference of data-line pair 32 is higher than the input offset voltage, the main amplifier 5 restrains itself from outputting a signal corresponding to data read out from a memory cell 33. The main amplifier 5 outputs a signal corresponding to the data in response to the inversion of the output signal of the differential amplifiers 70 and 71.

Figure 6:
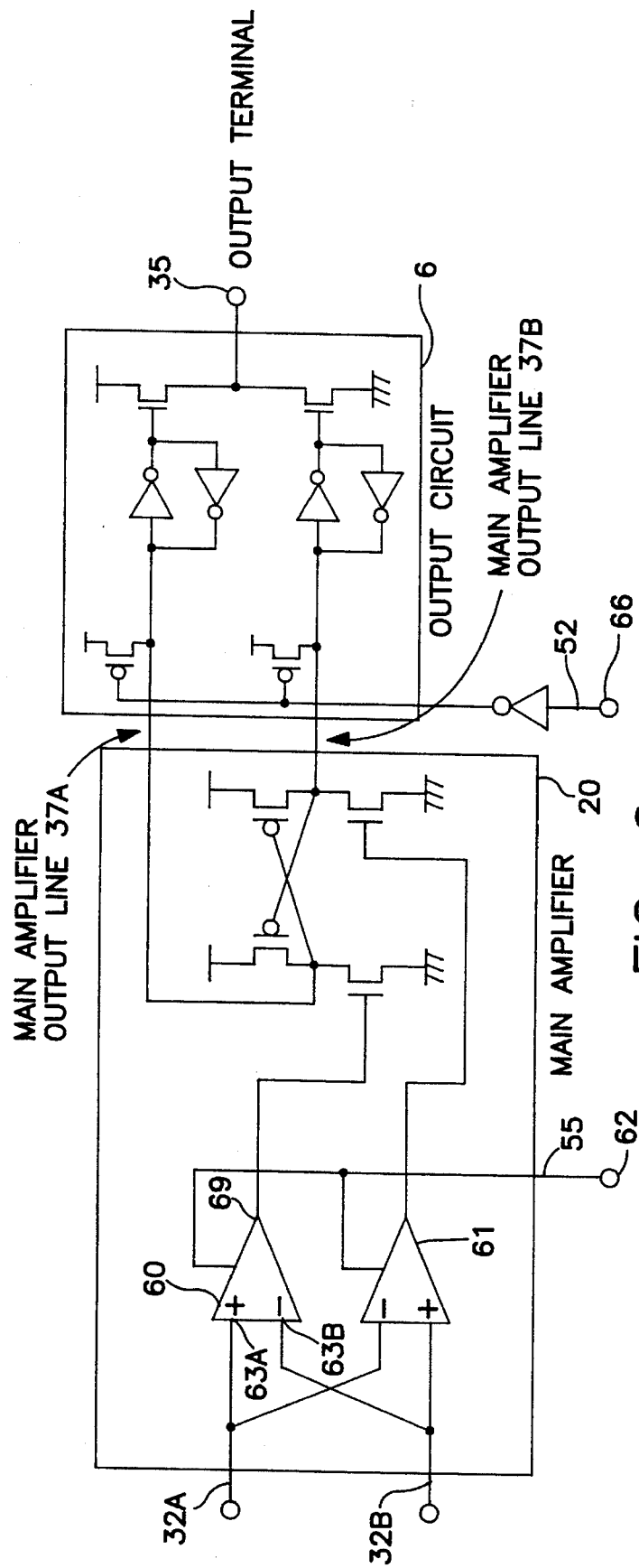
FIG. 6 shows a circuit for a main amplifier of the conventional semiconductor memory of FIG. 5.
Figure 7:
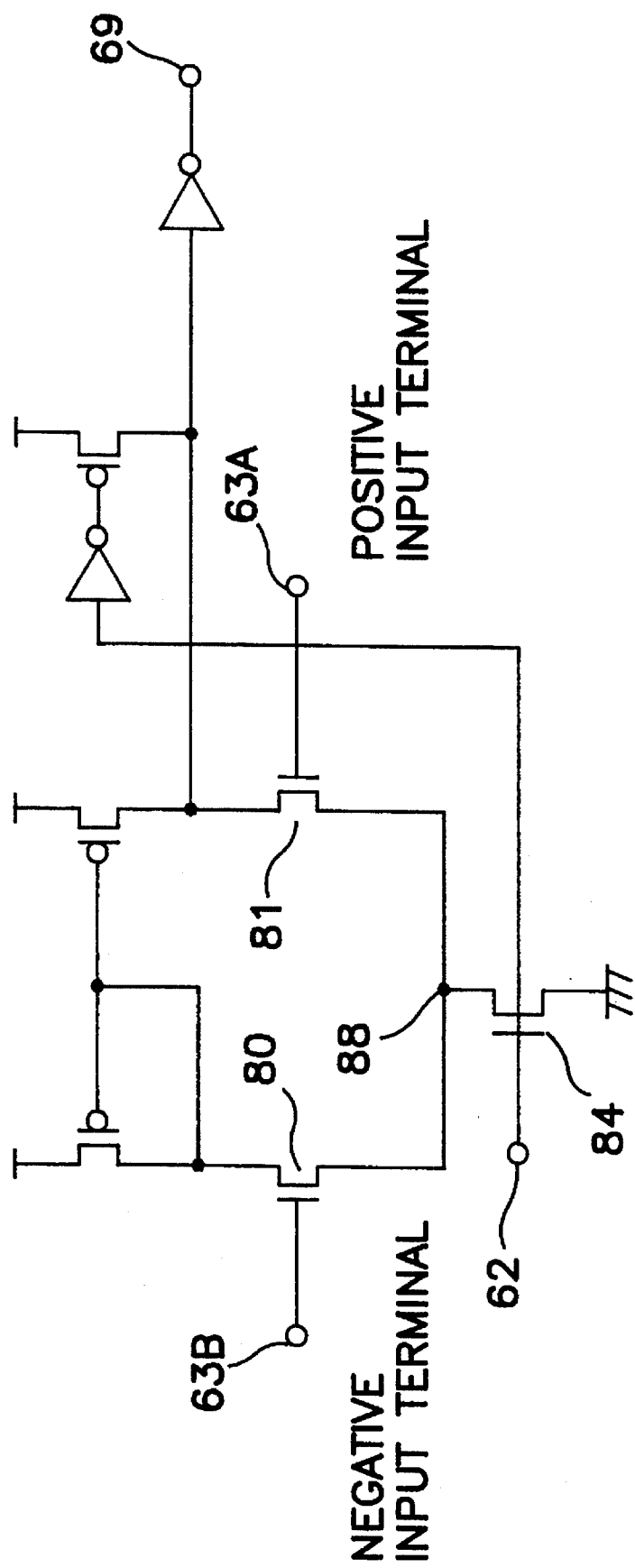
FIG. 7 shows a circuit for a differential amplifier included in the conventional main amplifier of FIG. 6.
Figure 9:
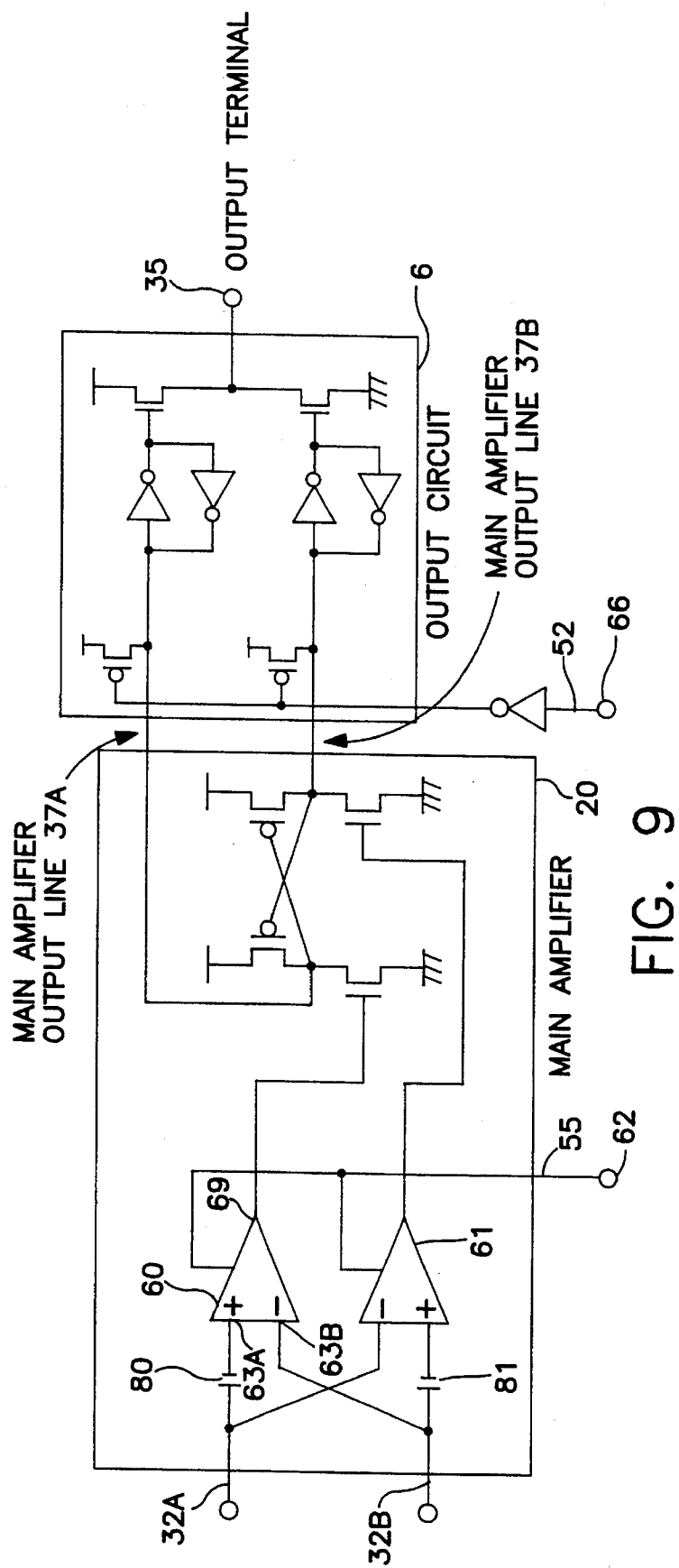
FIG. 9 schematically shows effects obtained by differential amplifiers of the present invention using conventional differential amplifiers.

FIG. 9 schematically shows effects obtained by the differential amplifiers 70 and 71 of the present invention using the conventional differential amplifiers 60 and 61 of FIG. 6. In FIG. 9, the differential amplifiers 60 and 61 are applied with the input offset voltage by batteries 80 and 81, respectively.

Figure 4:
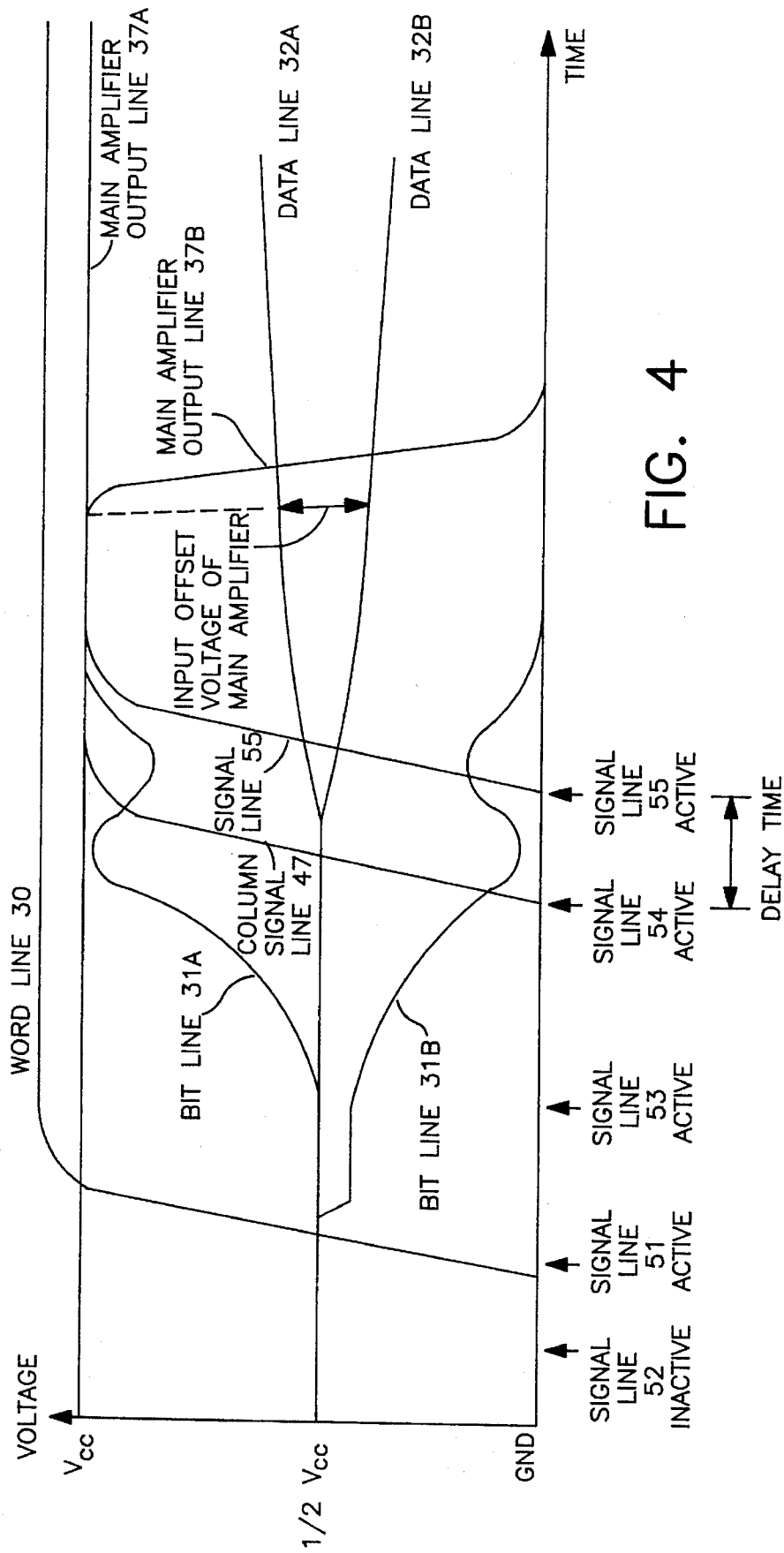
FIG. 4 shows electric potential change of each signal line during an operation of the semiconductor memory of FIG. 1.
Figure 8:
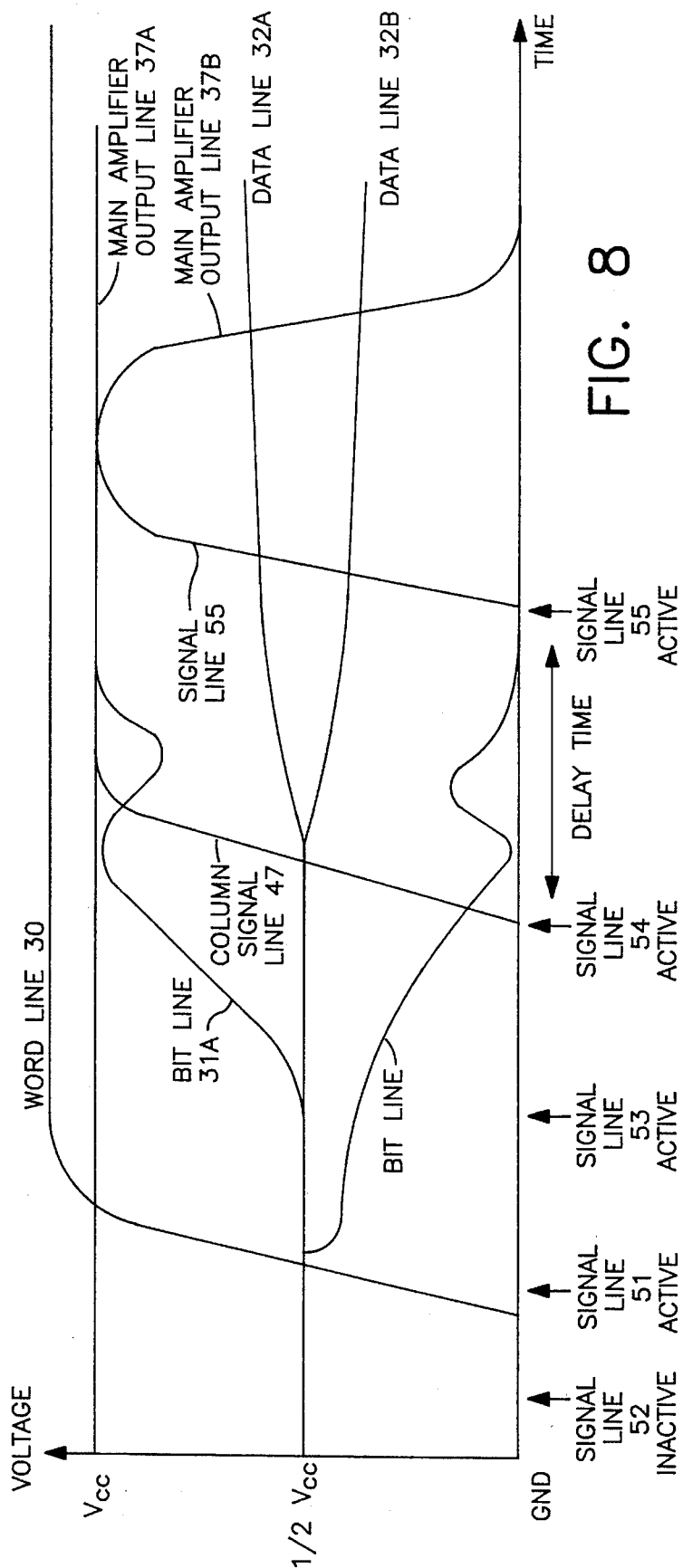
FIG. 8 shows electric potential change of each signal line during an operation of the conventional semiconductor memory of FIG. 5.

FIG. 4 shows electric potential variations of various signal lines during the operation of the semiconductor memory including the differential amplifiers 70 and 71 of FIG. 2. In FIG. 4, the horizontal axis represents time, and the vertical axis represents voltage. As shown in FIG. 4, the timing at which the signal line 55 for activating the main amplifier is set to be active occurs earlier than the timing shown in FIG. 8. The timing at which the signal line 55 is set to be active may coincide with the timing at which a column signal line 47 is set to be active. As a result, when the main amplifier 5 is activated, the electric potential difference between the data lines 31A and 31B is not sufficiently large, i.e., less than the above input offset voltage, so that both the main amplifier output lines 37A and 37B remain inactive (H). Only when the electric potential difference between the data lines 31A and 31B becomes higher than the above input offset voltage, the main amplifier output line 37B becomes active (L).

According to the present invention, the delay time from a time when the column signal line 47 is set to be active to a time when the signal line 55 for activating the main amplifier 5 is set to be active is not necessarily set. In other words, it is possible to keep the main amplifier inactive until the electric potential difference between the data lines 32A and 32B becomes sufficiently large. Even when the delay time or a period of time required for making the electric potential difference between the data lines 32A and 32B sufficiently large varies widely, the main amplifier 5 would not output wrong data. Therefore, according to the present invention, the semiconductor memory with a shortened access time can be provided by saving any unnecessary delay time.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory comprising a memory cell for storing data;

a bit-line pair connected to said memory cell, whereby said bit-line pair is charged to an electric potential corresponding to the data stored in said memory cell;

a data-line pair to be electrically connected to said bit-line pair; and a main amplifier having a pair of inputs respectively connected to said data-line pair for amplifying an electric potential difference of said data-line pair and outputting signals corresponding to said stored data to output lines, said main amplifier including input offset means for causing the signals on said output lines of said main amplifier to remain at inactive levels until said electric potential difference exceeds a predetermined input offset voltage, wherein said main amplifier identifies data as "L" or "H" after a period of time defined by a first time at which said main amplifier receives an activated signal for determining the timing of activating said main amplifier and a second time at which the electric potential difference of said data-line pair exceeds the predetermined input offset voltage.

2. A semiconductor memory according to claim 1, wherein, when said output lines of said main amplifier are set to be active, electric potentials thereof are at a low level (L); and when said output lines of said main amplifier are set to be inactive, electric potentials thereof are at a high level (H).

3. A semiconductor memory according to claim 1, wherein said main amplifier has a differential amplifier for outputting a signal according to a first and second signal, said first signal being supplied from one data line of said data-line pair, said second signal being supplied from the other data line of said data-line pair, and said differential amplifier outputs said signal after a period of time defined by said first time at which said first differential amplifier receives said activated signal for determining the timing of activating said main amplifier and said second time at which an electric potential of said first signal becomes higher than an electric potential of said second signal by said predetermined input offset voltage.

4. A semiconductor memory according to claim 1, wherein said main amplifier has a first and a second differential amplifier each for outputting a signal according to a first and a second signal, said first signal being supplied from one data line of the said data-line pair, said second signal being supplied from the other data line of said data-line pair, said first differential amplifier outputs said signal after a period of time defined by said first time at which said first differential amplifier receives an activated signal for determining the timing of activating said main amplifier and said second time at which an electric potential of said first signal becomes higher than an electric potential of said second signal by said predetermined input offset voltage, and said second differential amplifier outputs said signal after a period of time defined by said first time at which said second differential amplifier receives said activated signal for determining the timing of activating said main amplifier and said second time at which an electric potential of said second signal becomes higher than an electric potential of said first signal by said predetermined input offset voltage.

5. A semiconductor memory according to claim 3, wherein said differential amplifier has a first NMOS transistor and a second NMOS transistor, said first signal being supplied to the gate of said second NMOS transistor, said second signal being supplied to the gate of said first NMOS transistor, and a transistor for pulling down an electric potential of a junction between the source of said first NMOS transistor and the source of said second NMOS transistor; and an impedance is inserted between the source of said second NMOS transistor and said junction.

* * * * *